(12) United States Patent
Jung et al.

(10) Patent No.: US 9,942,952 B2
(45) Date of Patent: Apr. 10, 2018

(54) METHOD FOR MANUFACTURING GRAPHENE ELECTROMAGNETIC WAVE BLOCKING PLATE AND MICROWAVE OVEN USING SAME

(71) Applicant: LG ELECTRONICS INC., Seoul (KR)

(72) Inventors: Mynghee Jung, Seoul (KR); Jinsan Moon, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 433 days.

(21) Appl. No.: 14/430,593

(22) PCT Filed: Sep. 27, 2013

(86) PCT No.: PCT/KR2013/008677
§ 371 (c)(1),
(2) Date: Mar. 24, 2015

(87) PCT Pub. No.: WO2014/077504
PCT Pub. Date: May 22, 2014

(65) Prior Publication Data
US 2015/0250030 A1    Sep. 3, 2015

(30) Foreign Application Priority Data

Nov. 16, 2012  (KR) .................. 10-2012-0130385

(51) Int. Cl.
*H05B 6/76* (2006.01)
*G21F 1/12* (2006.01)
(Continued)

(52) U.S. Cl.
CPC ............ *H05B 6/766* (2013.01); *G21F 1/125* (2013.01); *G21F 3/00* (2013.01); *H05B 6/763* (2013.01);
(Continued)

(58) Field of Classification Search
CPC .... H05K 9/0081; H05K 9/0084; H05B 6/766; H05B 6/763; G21F 3/00; G21F 1/125
(Continued)

(56) References Cited

U.S. PATENT DOCUMENTS

| 2013/0068521 | A1 | 3/2013 | Hong et al. | |
| 2014/0218867 | A1* | 8/2014 | Kim | H05K 9/0088 361/704 |
| 2015/0337105 | A1* | 11/2015 | Takahashi | B32B 7/02 428/213 |

FOREIGN PATENT DOCUMENTS

| JP | H06-034298 U | 5/1994 |
| KR | 10-2007-0060940 A | 6/2007 |

(Continued)

OTHER PUBLICATIONS

European Search Report dated Apr. 18, 2016.
International Search Report dated Dec. 20, 2013 issued in Application No. PCT/KR2013/008677.

*Primary Examiner* — Quang Van
(74) *Attorney, Agent, or Firm* — KED & Associates, LLP

(57) ABSTRACT

The present invention relates to graphene and, more particularly, to a method for manufacturing a graphene electromagnetic wave blocking plate capable of blocking electromagnetic waves by using graphene, and a microwave oven using same. The present invention includes: a step of forming a first graphene layer and a second graphene layer above and below a catalytic metal layer; a step of attaching a supporting substrate onto the second graphene layer; a step of forming a pattern on at least either one of the first graphene layer or the catalytic metal layer; and a step of removing the supporting substrate.

20 Claims, 4 Drawing Sheets

(51) Int. Cl.
*H05K 9/00* (2006.01)
*G21F 3/00* (2006.01)

(52) U.S. Cl.
CPC ......... *H05K 9/0081* (2013.01); *H05K 9/0084* (2013.01)

(58) Field of Classification Search
USPC ............ 219/729, 736–741; 216/20; 361/704; 174/388, 251
See application file for complete search history.

(56) References Cited

FOREIGN PATENT DOCUMENTS

| KR | 10-1003840 B1 | 12/2010 |
|---|---|---|
| KR | 10-2011-0090398 A | 8/2011 |
| KR | 10-1166528 B1 | 7/2012 |
| WO | WO 2011/096700 | 8/2011 |
| WO | WO 2011/108878 | 9/2011 |
| WO | WO 2012/067438 | 5/2012 |

\* cited by examiner

METHOD FOR MANUFACTURING GRAPHENE ELECTROMAGNETIC WAVE BLOCKING PLATE AND MICROWAVE OVEN USING SAME

CROSS-REFERENCE TO RELATED PATENT APPLICATIONS

This application is a U.S. National Stage Application under 35 U.S.C. §371 of PCT Application No. PCT/KR2013/008677, filed Sep. 27, 2013, which claims priority to Korean Patent Application No. 10-2012-0130385, filed Nov. 16, 2012, whose entire disclosures are hereby incorporated by reference.

TECHNICAL FIELD

The present invention relates to graphene and, more particularly, to a method for manufacturing a graphene electromagnetic wave blocking plate capable of shielding electromagnetic waves using graphene and a microwave oven using the same.

BACKGROUND ART

Electronic devices incorporate internal components that generate electromagnetic waves, such as a microprocessor including an integrated circuit, and the electromagnetic waves cause malfunction of the appliances, or have a negative effect on the human body.

Electromagnetic wave shielding technology serves to protect external equipment by shielding the periphery of an electromagnetic wave generation source or to protect internal components from external influence by electromagnetic waves.

A microwave oven is an apparatus that cooks an object (food) using microwaves that mainly have a constant wavelength. The microwave oven internally defines a heating space for cooking of food and the heating space is adapted to be opened or closed by a door.

To heat food received in the heating space, microwaves generated by a magnetron are fed into the heating space. At this time, although the food must be uniformly heated by microwaves, microwaves have difficulty in uniformly heating the food that is kept stationary due to wavelength characteristics of microwaves.

Therefore, upon heating of food by microwaves, to achieve uniform heating of the food, a tray on which the food is disposed is rotated to cause microwaves to be more uniformly introduced into the food.

The microwave oven is advantageously capable of reducing cooking time and directly heating the interior of food using heat generated when molecules intensively vibrate using a short wavelength of radio frequency (in a range of 2400 MHz to 2500 MHz), but suffers from generation of electromagnetic waves.

DISCLOSURE

Technical Problem

An object of the present invention devised to solve the problem lies in a method for manufacturing a graphene electromagnetic wave blocking plate to shield electromagnetic waves.

Another object of the present invention is to provide a microwave oven having a graphene electromagnetic wave blocking plate to shield electromagnetic waves.

Technical Solution

In one aspect of the present invention, the object of the present invention can be achieved by providing a method for manufacturing a graphene electromagnetic wave blocking plate. The method for manufacturing a graphene electromagnetic wave blocking plate includes forming a first graphene layer and a second graphene layer respectively on and beneath a catalyst metal layer, attaching a support substrate to the second graphene layer, patterning at least one of the first graphene layer and the catalyst metal layer, and removing the support substrate.

In another aspect of the present invention, provided herein is a microwave oven having a heating space, the microwave oven including a front panel configured to close a front side of the heating space, the front panel having an observation opening, a cover panel disposed on the front panel to cover the observation opening, and an electromagnetic wave blocking plate disposed on the cover panel, the electromagnetic wave blocking plate including a graphene layer

Advantageous Effects

According to the present invention, it is possible to provide a graphene electromagnetic wave blocking plate, which is capable of absorbing electromagnetic waves via graphene layers that are grown on and beneath a catalyst metal layer and of shielding electromagnetic waves by patterning the catalyst metal layer to form a metal pattern and adjusting diameters of holes formed in the metal pattern.

According to the present invention, it is possible to shield electromagnetic waves by attaching a graphene electromagnetic wave blocking plate to an inner surface of a cover of an electronic appliance.

According to the present invention, providing a door of a microwave oven with a graphene electromagnetic wave blocking plate has the effect of shielding electromagnetic waves to prevent outward leakage of electromagnetic waves emitted to a heating space defined in the microwave oven for cooking of food.

The technical effects of the present invention are not limited to those described above and other technical effects not described herein will be clearly understood by those skilled in the art from the following description.

MODE FOR INVENTION

Hereinafter, embodiments of the present invention will be described in detail with reference to the accompanying drawings.

The present invention allows various modifications and variations and specific embodiments thereof are exemplified with reference to drawings and will be described in detail. The present invention should not be construed as limited to the embodiments set forth herein and includes modifications, variations, equivalents, and substitutions compliant with the spirit or scope of the present invention defined by the appended claims.

It will be understood that when an element such as a layer, area or substrate is referred to as being "on" another element, it can be directly on the element, or one or more intervening elements may also be present therebetween.

In addition, it will be understood that although terms such as "first" and "second" may be used herein to describe elements, components, areas, layers and/or regions, the elements, components, areas, layers and/or regions should not be limited by these terms.

Figure 1:
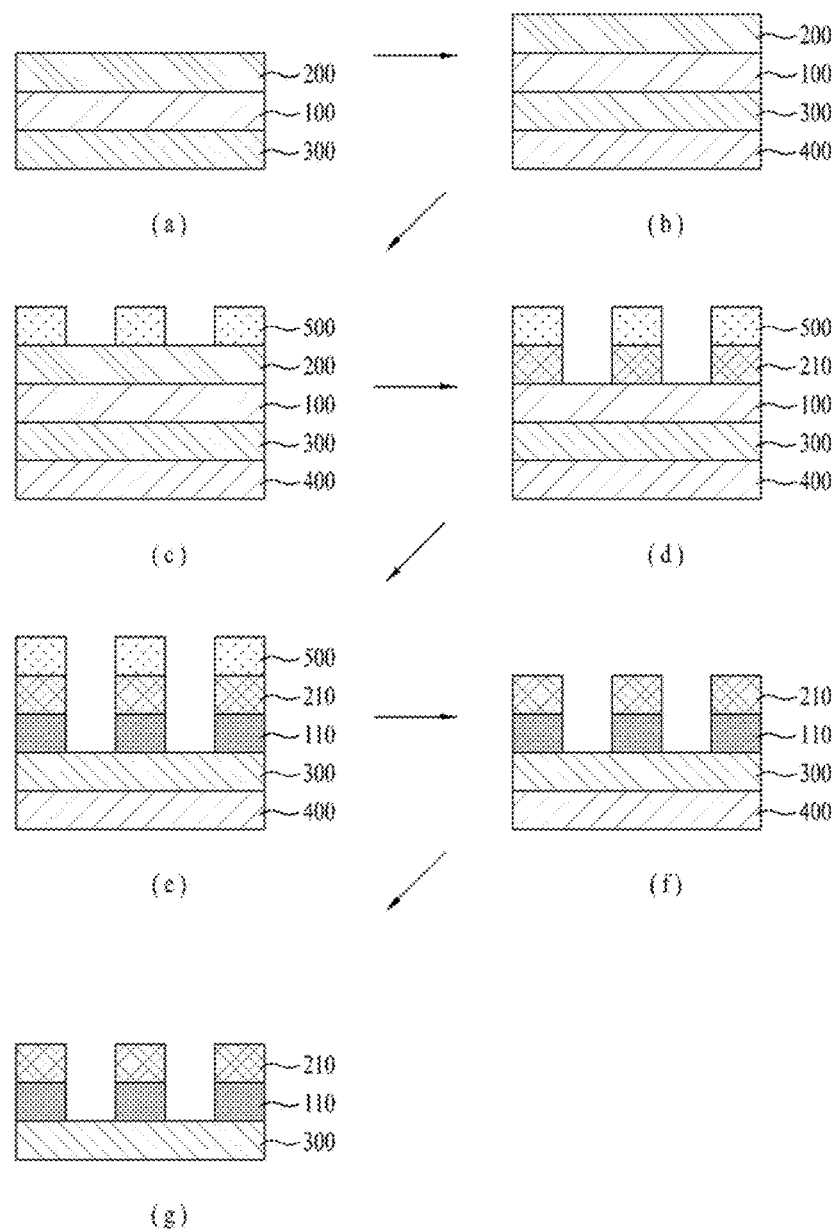
FIG. 1 shows sectional views illustrating the process sequence of a method for manufacturing a graphene electromagnetic wave blocking plate according to one embodiment of the present invention.

FIG. 1 shows sectional views of the process sequence of a method for manufacturing a graphene electromagnetic wave blocking plate according to one embodiment of the present invention.

Referring to FIG. 1(a), a first graphene layer 200 and a second graphene layer 300 are formed on and beneath a catalyst metal layer 100.

A catalyst metal is a metal capable of growing graphene, and may include any one selected from the group consisting of nickel (Ni), cobalt (Co), iron (Fe), platinum (Pt), gold (Au), aluminum (Al), chrome (Cr), copper (Cu), magnesium (Mg), manganese (Mn), molybdenum (Mo), rhodium (Rh), silicon (Si), tantalum (Ta), titanium (Ti), tungsten (W), uranium (U), vanadium (V), and zirconium (Zr), and may be formed of a single layer of any one of these components or alloys of at least two of these components. In addition, the catalyst metal is more preferably a metal that is usable as a metal pattern to shield electromagnetic waves. For example, the catalyst metal layer 100 may comprise copper (Cu).

To form the graphene layers on and beneath the catalyst metal layer 100, a variety of deposition methods may be used. For example, graphene may be synthesized by chemical vapor deposition (CVD) using a catalyst metal. Examples of the chemical vapor deposition include thermal chemical vapor deposition (T-CVD), inductively coupled plasma chemical vapor deposition (ICP-CVD), plasma enhanced chemical vapor deposition (PE-CVD), and microwave chemical vapor deposition (microwave CVD). In addition, various other methods, such as rapid thermal annealing (RTA), atomic layer deposition (ALD), and physical vapor deposition (PVD), may be used.

Referring to FIG. 1(b), a support substrate 400 is attached to a lower surface of the second graphene layer 300.

The support substrate 400 may be a thermal release tape, ultraviolet (UV) tape, or polymethyl methacrylate (PMMA) substrate. Note that the support substrate is not limited thereto and any other adhesive materials capable of supporting a graphene layer are possible.

Referring to FIGS. 1(c) to 1(f), the first graphene layer 200 and the catalyst metal layer 100 are subjected to patterning. This patterning of the first graphene layer 200 and the catalyst metal layer 100 may include forming a resist pattern 500 on the first graphene layer 200, etching the first graphene layer 200 exposed through holes of the resist pattern 500, etching the catalyst metal layer 100 that exposed via the etching of the first graphene layer 200, and removing the resist pattern 500.

More specifically, referring to FIG. 1(c), the resist pattern 500 may be formed on the first graphene layer 200.

The resist pattern 500 may be acquired by forming a resist layer on the first graphene layer 200 and patterning the formed resist layer. At this time, the resist layer may be formed using any of various methods, such as spin coating.

In addition, the resist layer may be patterned using a lithography method. More specifically, this patterning may be performed using nano-imprint lithography, laser interference lithography, electron beam lithography, ultraviolet lithography, holographic lithography, or immersion lithography.

Meanwhile, the resist pattern 500 may be a hole pattern or mesh pattern.

Referring to FIG. 1(d), the first graphene layer 200 exposed through holes formed in the resist pattern 500 may be etched.

For example, the first graphene layer 200 exposed through the holes formed in the resist pattern 500 may be etched via a plasma process.

In this way, the first graphene layer 200 may be patterned into the same shape as the resist pattern 500 to form a graphene pattern 210. Thus, the resulting graphene pattern 210 may be a hole pattern or mesh pattern.

Referring to FIG. 1(e), the catalyst metal layer 100, exposed via the etching of the first graphene layer 200, may be etched. More specifically, a portion of the catalyst metal layer 100, which has been exposed through holes formed in the graphene pattern 210 acquired via the etching of the first graphene layer 200, may be etched.

For example, the catalyst metal layer 100 exposed through the holes of the graphene pattern 210 may be etched using an etchant.

In this way, the catalyst metal layer 100 also has the same pattern shape as the resist pattern 500 and the graphene pattern 210. That is, a metal pattern 110 may be formed by patterning the catalyst metal layer 100.

Referring to FIG. 1(f), the resist pattern 500 may be removed.

Referring to FIG. 1(g), the support substrate 400 may be removed. In this way, a graphene electromagnetic wave blocking plate, which includes the second graphene layer 300, the metal pattern 110 disposed on the second graphene layer 300, and the graphene pattern 210 disposed on the metal pattern 110, may be manufactured.

Accordingly, both the second graphene layer 300 and the graphene pattern 210 may absorb electromagnetic waves, so as to achieve double electromagnetic wave shielding effects.

In addition, the metal pattern 110, which is formed by patterning the catalyst metal layer 100 that is used to grow graphene, may serve as a shielding window to shield electromagnetic waves.

At this time, the holes of the metal pattern 110 preferably have a diameter of 5 mm or less. That is, a diameter of holes of the hole pattern or mesh pattern is preferably 5 mm or less.

When the diameter of the holes of the metal pattern 110 is above 5 mm, electromagnetic waves may pass through the pattern holes, which may cause deterioration in electromagnetic wave shielding effects.

Figure 2:
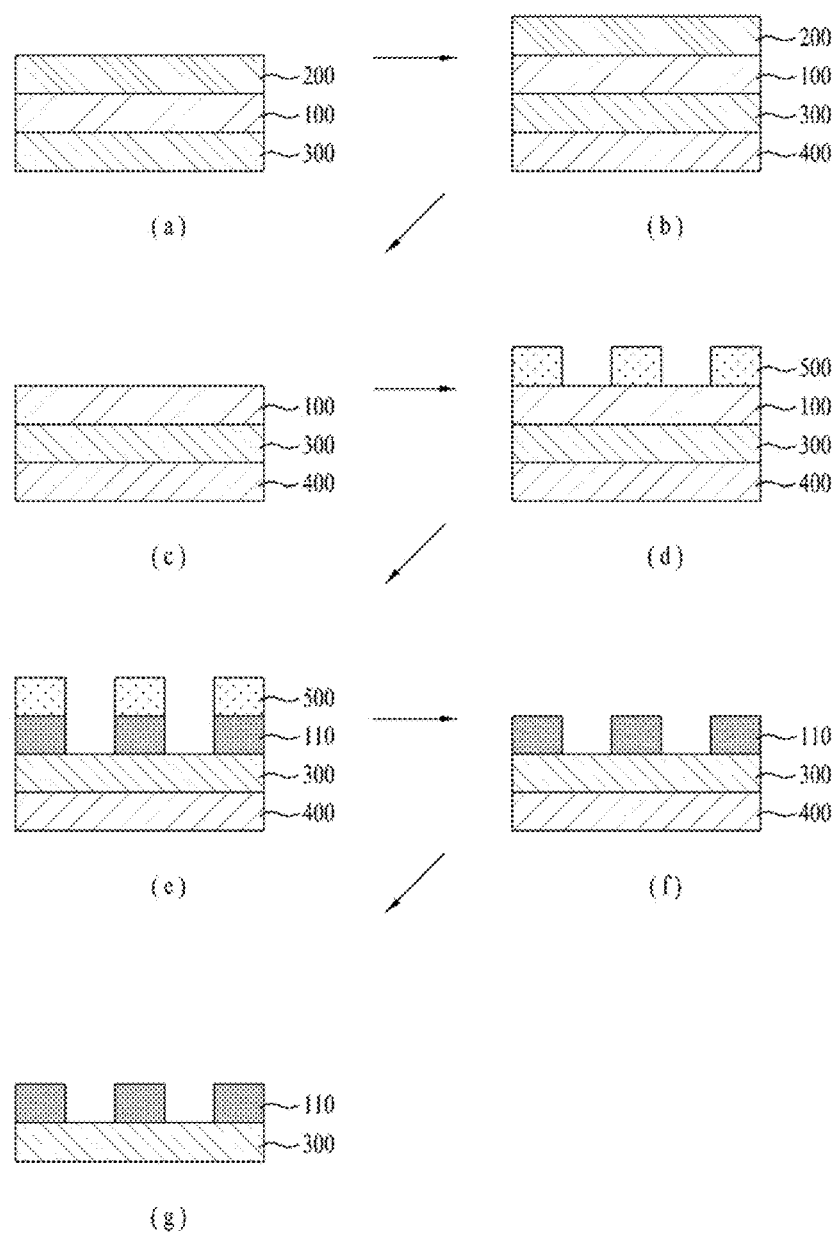
FIG. 2 shows sectional views illustrating the process sequence of a method for manufacturing a graphene electromagnetic wave blocking plate according to one embodiment of the present invention.

FIG. 2 shows sectional views illustrating the process sequence of a method for manufacturing a graphene electromagnetic wave blocking plate according to another embodiment of the present invention.

Referring to FIG. 2(a), the first graphene layer 200 and the second graphene layer 300 are respectively formed on and beneath the catalyst metal layer 100.

The catalyst metal layer 100 may be formed of a catalyst metal that is capable of growing graphene and may also serve as an electromagnetic wave shielding window. For example, the catalyst metal may include any one selected from the group consisting of nickel (Ni), cobalt (Co), iron (Fe), platinum (Pt), gold (Au), aluminum (Al), chrome (Cr), copper (Cu), magnesium (Mg), manganese (Mn), molybdenum (Mo), rhodium (Rh), silicon (Si), tantalum (Ta), titanium (Ti), tungsten (W), uranium (U), vanadium (V), and zirconium (Zr), and may be formed of a single layer of any one of these components or alloys of at least two of these components.

To form the graphene layers on and beneath the catalyst metal layer 100, various methods, such as a chemical vapor deposition (CVD) method, may be used.

For example, by providing the catalyst metal layer 100 with a carbon source, such as high-temperature methane ($CH_4$) or acetylene ($C_2H_2$), and causing reaction therebetween, the first graphene layer 200 and the second graphene layer 300 may be formed on and beneath the catalyst metal layer 100.

Referring to FIG. 2(b), the support substrate 400 is attached to the lower surface of the second graphene layer 300.

The support substrate 400 may be a thermal release tape, UV tape, or polymethyl methacrylate (PMMA) substrate. Note that the support substrate is not limited thereto and any other adhesive materials capable of supporting a graphene layer are possible.

Referring to FIG. 2(c), the first graphene layer 200 may be removed. For example, the first graphene layer 200 may be removed via plasma processing.

Referring to FIG. 2(d), the resist pattern 500 may be formed on the catalyst metal layer 100 from which the first graphene layer 200 has been removed.

The resist pattern 500 may be acquired by forming a resist layer on the catalyst metal layer 100 and patterning the formed resist layer.

The resist layer may be formed using any of various methods, such as spin coating, and patterning of the resist layer may be performed using a lithography method. More specifically, this patterning may be performed using nanoimprint lithography, laser interference lithography, electron beam lithography, ultraviolet lithography, holographic lithography, or immersion lithography.

Meanwhile, the resist pattern 500 may be a hole pattern or mesh pattern.

Referring to FIG. 2(e), the catalyst metal layer 100 exposed through holes formed in the resist pattern 500 may be etched.

For example, the catalyst metal layer 100 exposed through the holes of the resist pattern 500 may be etched using an etchant.

In this way, the catalyst metal layer 100 may be patterned into the same pattern shape as the resist pattern 500 to form a metal pattern 110. Accordingly, the metal pattern 110 may also be a hole pattern or mesh pattern.

Referring to FIG. 2(f), the resist pattern 500 may be removed.

Referring to FIG. 2(g), the support substrate 400 may be removed. In this way, a graphene electromagnetic wave blocking plate, which includes the second graphene layer 300 and the metal pattern 110 disposed on the second graphene layer 300, may be manufactured.

Accordingly, the second graphene layer 300 may prevent discharge of electromagnetic waves by absorbing the electromagnetic waves, and the metal pattern 110 formed by patterning the catalyst metal layer 100 that is used to grow graphene may serve as a shielding window to shield electromagnetic waves.

At this time, holes of the metal pattern 110 preferably have a diameter of 5 mm or less. That is, a diameter of holes of the hole pattern or mesh pattern is preferably 5 mm or less.

When the diameter of the holes of the metal pattern 110 is above 5 mm, electromagnetic waves may pass through the pattern holes, which may cause deterioration in electromagnetic wave shielding effects.

The above-described graphene electromagnetic wave blocking plate is disposed to shield an electromagnetic wave generation source that generates electromagnetic waves, thereby achieving electromagnetic wave shielding effects.

For example, in the case of a cellular phone or laptop computer, while a special paint to shield electromagnetic waves has been applied to an inner surface of an outwardly exposed front cover or rear cover so as to shield electromagnetic waves, the graphene electromagnetic wave blocking plate provided with a mesh pattern according to the present invention may be attached to the front cover or rear cover.

That is, in the case of an electronic appliance having an electromagnetic wave generation source and a front cover or rear cover, the graphene electromagnetic wave blocking plate, which includes the graphene layer and the metal pattern disposed on the graphene layer, may be attached to an inner surface of the front cover or the rear cover. At this time, the metal pattern may be a hole pattern or mesh pattern. Meanwhile, the graphene layer may be a patterned graphene layer. In addition, the graphene electromagnetic wave blocking plate may further include a graphene pattern disposed on the metal pattern.

Accordingly, the graphene electromagnetic wave blocking plate attached to the inner surface of the cover of the electronic appliance may prevent outward discharge of electromagnetic waves.

Hereinafter, a door of a microwave oven manufactured using the above-described graphene electromagnetic wave blocking plate will be described.

Figure 3:
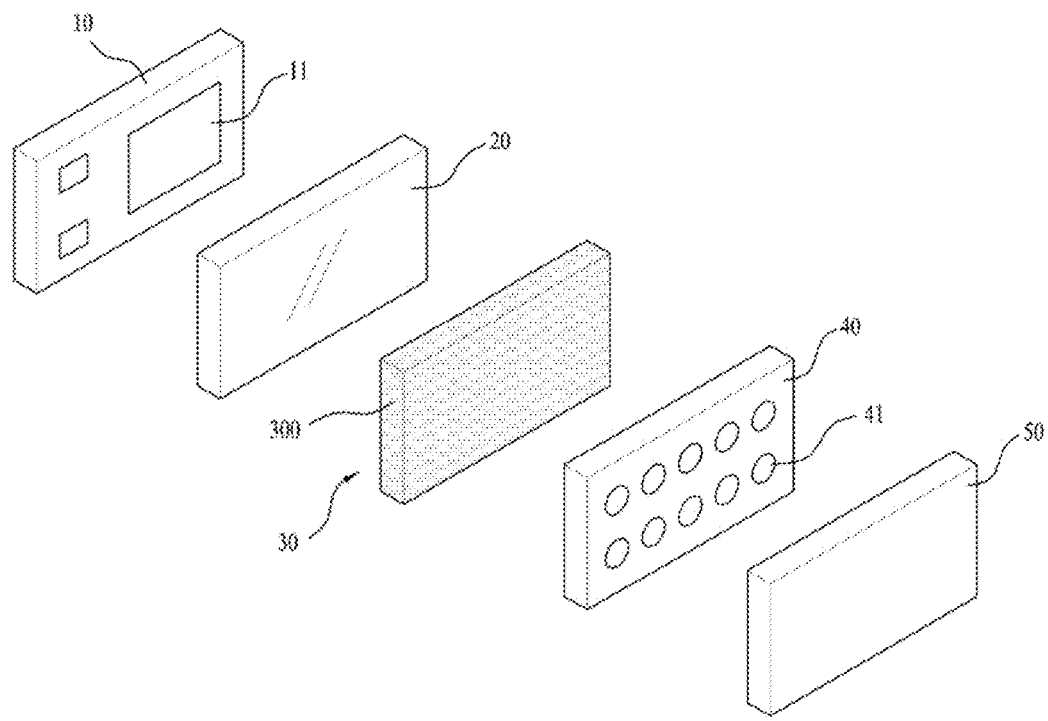
FIG. 3 is an exploded perspective view showing a door of a microwave oven according to one embodiment of the present invention.

FIG. 3 is an exploded perspective view showing a door of a microwave oven according to one embodiment of the present invention.

Referring to FIG. 3, the door of the microwave oven includes a front panel 10, a cover panel 20, a graphene electromagnetic wave blocking plate 30, and a shielding window 40.

The front panel 10 serves to close the front side of a heating space and is provided with an observation opening 11. The observation opening 11 may serve to assist a user in observing the interior of the heating space in which food is cooked.

The cover panel 20 is attached to an inner surface of the front panel 10 to cover the observation opening 11. The cover panel 20 may be formed of a transparent material to allow the user to see the interior of the heating space from the outside of the microwave oven. For example, the cover panel 20 may be formed of a glass material.

The graphene electromagnetic wave blocking plate 30 is attached to an inner surface of the cover panel 20 to shield electromagnetic waves.

The graphene electromagnetic wave blocking plate 30 may include the graphene layer 300. Accordingly, the graphene layer 300 may prevent electromagnetic waves from leaking out of the microwave oven by absorbing the electromagnetic waves. The graphene layer 300 may use the graphene layer or graphene pattern as described above with reference to FIGS. 1 and 2.

Meanwhile, graphene is a high transmittance material and does not interfere with observation of the interior of the heating space through the observation opening 11 from the outside.

The shielding window 40 is attached to an inner surface of the graphene electromagnetic wave blocking plate 30 and has shielding holes 41 to shield electromagnetic waves.

The shielding holes 41 formed in the shielding window 40 may serve as a region to assist the user in observing the interior of the heating space through the observation opening 11 from the outside. In addition, a diameter of the shielding holes 41 may be adjusted to prevent passage of electromagnetic waves through the shielding holes 41, which allows the shielding holes 41 to exhibit electromagnetic wave shielding effects. Accordingly, to prevent passage of electromagnetic waves through the shielding holes 41, a diameter of the shielding holes 41 is preferably 5 mm or less.

The shielding window 40 may be formed of a metal material. In addition, the shielding window 40 may be a metal mesh.

Meanwhile, the shielding window 40 may be located between the cover panel 20 and the graphene electromagnetic-wave blocking plate 30.

Meanwhile, the door of the microwave oven may further include a fixing member 50 located inside the shielding window 40. The fixing member 50 serves to secure the graphene electromagnetic wave blocking plate 30 and the shielding window 40 to the inner surface of the front panel 10.

According to the present invention, graphene is advantageously capable of absorbing electromagnetic waves of all wavelengths. Accordingly, as the shielding window 40 primarily shields electromagnetic waves generated in the microwave oven and the graphene electromagnetic wave blocking plate 30 including the graphene layer absorbs electromagnetic waves that are outwardly emitted rather than being shielded by the shielding window 40, it is possible to reduce the strength of electromagnetic waves to be emitted outward.

Figure 4:
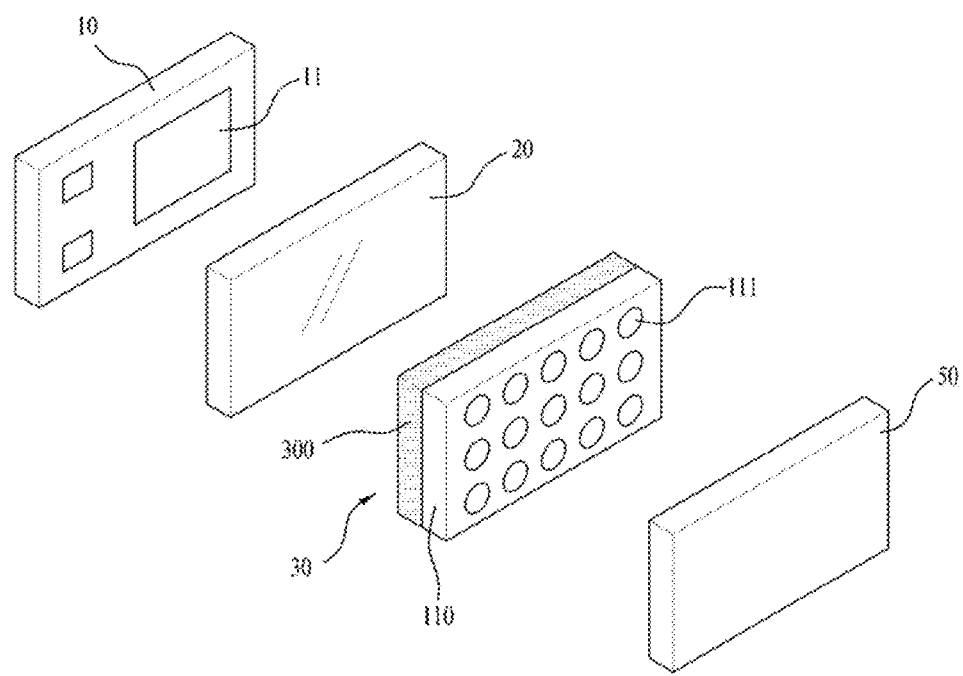
FIG. 4 is an exploded perspective view showing a door of a microwave oven according to one embodiment of the present invention.

FIG. 4 is an exploded perspective view showing a door of a microwave oven according to one embodiment of the present invention.

Referring to FIG. 4, the door of the microwave oven includes the front panel 10, the cover panel 20, and the graphene electromagnetic wave blocking plate 30.

The front panel 10 serves to close the front side of a heating space and is provided with the observation opening 11. The observation opening 11 may serve to assist the user in observing the interior of the heating space in which food is cooked.

The cover panel 20 is attached to the inner surface of the front panel 10 to cover the observation opening 11. The cover panel 20 may be formed of a transparent material to allow the user to observe the interior of the heating space from the outside of the microwave oven. For example, the cover panel 20 may be formed of a glass material.

The graphene electromagnetic wave blocking plate 30 is attached to the inner surface of the cover panel 20 to shield electromagnetic waves.

The graphene electromagnetic wave blocking plate 30 may include the graphene layer 300 and the metal pattern 110 disposed on the graphene layer 300.

The graphene layer 300 may use the graphene layer or graphene pattern as described above with reference to FIGS. 1 and 2. In addition, the metal pattern 110 may have pattern holes 111. The pattern holes 111 may have any of various cross sectional shapes, such as a circular, elliptical, polygonal, or diamond shape. For example, the metal pattern 110 may be a hole pattern or mesh pattern, and a diameter of the pattern holes may be 5 mm or less.

Accordingly, the graphene layer 300 may prevent outward discharge of electromagnetic waves by absorbing the electromagnetic waves, and the metal pattern 110 may also prevent outward discharge of electromagnetic waves via adjustment in the diameter of the pattern holes 111.

In this case, the metal pattern, formed by patterning the catalyst metal layer that is used to grow graphene, may serve as a shielding window to shield electromagnetic waves, rather than being removed, which advantageously eliminate a need to provide a separate shielding window.

In addition, the graphene layer 300 and the metal pattern 100 are integrally formed with each other, which is advantageous in terms of a manufacturing process.

Moreover, the graphene electromagnetic wave blocking plate 30 may further include a graphene pattern (not shown) disposed on the metal pattern 110. More specifically, by growing graphene layers on and beneath a catalyst metal layer and patterning the catalyst metal layer and one of the graphene layers, the graphene electromagnetic wave blocking plate 30 including double graphene layers may be manufactured.

Meanwhile, the door of the microwave oven may further include the fixing member 50 located inside the graphene electromagnetic wave blocking plate 30. The fixing member 50 serves to secure the graphene electromagnetic wave blocking plate 30 to the inner surface of the front panel 10.

In addition, in the case of the door of the microwave oven according to the present invention, the graphene electromagnetic wave blocking plate 30, which includes the graphene pattern including a mesh pattern and the metal pattern 110 except for the metal shielding window (40, see FIG. 3), may be located between and secured to the front panel 10 and the fixing member 50.

Accordingly, by providing the door of the microwave oven with the graphene electromagnetic wave blocking plate 30, the graphene layer may prevent discharge of electromagnetic waves from the microwave oven by absorbing the electromagnetic waves, and the metal pattern acquired by patterning the catalyst metal layer may also prevent outward discharge of electromagnetic waves via adjustment in the diameter of the pattern holes.

It will be apparent to those skilled in the art that various modifications and variations can be made in the present invention without departing from the spirit or scope of the invention. Thus, it is intended that the present invention cover the modifications and variations of this invention provided they come within the scope of the appended claims and their equivalents.

INDUSTRIAL APPLICABILITY

According to the present invention, a graphene electromagnetic wave blocking plate capable of effectively shielding electromagnetic waves may be provided.

According to the present invention, providing a door of a microwave oven with a graphene electromagnetic wave blocking plate has the effect of shielding electromagnetic waves to prevent outward leakage of electromagnetic waves emitted to a heating space defined in the microwave oven for cooking of food.

The invention claimed is:

1. A method for manufacturing a graphene electromagnetic wave blocking plate, the method comprising:
    forming a first graphene layer and a second graphene layer respectively on and beneath a catalyst metal layer;
    attaching a support substrate to the second graphene layer;
    patterning the first graphene layer and the catalyst metal layer; and
    removing the support substrate, wherein patterning the first graphene layer and the catalyst metal layer is performed so as to form a metal pattern and a graphene pattern on the second graphene layer, and wherein the metal pattern is located between the graphene pattern and the second graphene layer.

2. The method according to claim 1, wherein the patterning includes:
    forming a resist pattern on the first graphene layer;
    etching the first graphene layer exposed through holes of the resist pattern;
    etching the catalyst metal layer exposed via the etching of the first graphene layer; and
    removing the resist pattern.

3. The method according to claim 1, wherein the patterning includes patterning the first graphene layer and the catalyst metal layer into the same shape.

4. The method according to claim 1, further comprising removing the first graphene layer.

5. The method according to claim 4, wherein the patterning includes patterning the catalyst metal layer exposed via removal of the first graphene layer.

6. The method according to claim 5, wherein the patterning of the catalyst metal layer includes:
    forming a resist pattern on the catalyst metal layer; and
    etching the catalyst metal layer using the resist pattern.

7. The method according to claim 1, wherein the patterned layer takes the form of a hole pattern or a mesh pattern.

8. The method according to claim 1, wherein the patterned layer has holes having a diameter of 5 mm or less.

9. A graphene electromagnetic wave blocking plate manufactured using the method according to claim 1.

10. A microwave including the electromagnetic wave blocking plate of claim 9.

11. A microwave oven having a heating space, the microwave oven comprising:
    a front panel configured to close a front side of the heating space, the front panel having an observation opening;
    a cover panel disposed on the front panel to cover the observation opening; and
    an electromagnetic wave blocking plate disposed on the cover panel, wherein the electromagnetic wave blocking plate includes:
        a graphene layer;
        a metal pattern on the graphene layer; and
        a graphene pattern on the metal pattern.

12. The microwave oven according to claim 11, further comprising a shielding window attached to the electromagnetic wave blocking plate, the shielding window having a shielding hole configured to shield electromagnetic waves.

13. The microwave oven according to claim 11, further comprising a fixing member disposed on the electromagnetic wave blocking plate to secure the electromagnetic wave blocking plate to the front panel.

14. The microwave oven according to claim 11, wherein the metal pattern is a hole pattern or a mesh pattern.

15. The microwave oven according to claim 11, wherein the metal pattern is located between the graphene pattern and the graphene layer.

16. The microwave oven according to claim 15, wherein the graphene pattern has the same shape as the metal pattern.

17. A method for manufacturing a graphene electromagnetic wave blocking plate, the method comprising:
    forming a first graphene layer and a second graphene layer respectively on a first and a second surface of a catalyst metal layer;
    attaching an adhesive support substrate to the second graphene layer;
    forming a resist pattern including holes on the first graphene layer;
    etching the first graphene layer exposed through holes of the resist pattern;
    etching the catalyst metal layer exposed through the etching of the first graphene layer;
    removing the resist pattern; and
    removing the adhesive support substrate, wherein the first graphene layer and the catalyst metal layer are patterned identically through the resist pattern to form a catalyst metal pattern and a graphene pattern, respectively, and wherein the catalyst metal pattern is located between the graphene pattern and the second graphene layer.

18. The method according to claim 17, wherein the resist pattern takes the form of a hole pattern or a mesh pattern.

19. The method according to claim 17, wherein the holes of the resist pattern each have a diameter of 5 mm or less.

20. The method according to claim 17, wherein the catalyst metal layer is formed of a metal capable of growing graphene and shielding electromagnetic waves.

* * * * *